United States Patent
Kurtze et al.

(10) Patent No.: US 7,239,255 B2
(45) Date of Patent: Jul. 3, 2007

(54) CORRECTING CHARGE TRANSFER INEFFICIENCY IN A CHARGE COUPLED ANALOG TO DIGITAL CONVERTER

(75) Inventors: Jeffery D. Kurtze, Hudson, NH (US); Michael P. Anthony, Andover, MA (US)

(73) Assignee: Kenet, Inc., Woburn, MA (US)

( * ) Notice: Subject to any disclaimer, the term of this patent is extended or adjusted under 35 U.S.C. 154(b) by 0 days.

(21) Appl. No.: 11/254,070

(22) Filed: Oct. 19, 2005

(65) Prior Publication Data
US 2007/0085724 A1    Apr. 19, 2007

(51) Int. Cl.
*H03M 1/06* (2006.01)
(52) U.S. Cl. .................. 341/118; 341/163
(58) Field of Classification Search ............ 341/120, 341/118, 122, 155, 156, 172, 161, 163
See application file for complete search history.

(56) References Cited

U.S. PATENT DOCUMENTS

| | | | |
|---|---|---|---|
| 4,224,585 A | 9/1980 | Tanaka | |
| 4,375,059 A | 2/1983 | Schlig | |
| 4,471,341 A | 9/1984 | Sauer | |
| 4,672,644 A | 6/1987 | Acker | |
| 5,515,102 A | 5/1996 | Pearsall et al. | |
| 5,579,007 A | 11/1996 | Paul | |
| 5,786,783 A * | 7/1998 | Hasegawa | 341/172 |
| 6,606,042 B2 * | 8/2003 | Sonkusale et al. | 341/120 |

* cited by examiner

*Primary Examiner*—Brian Young
(74) *Attorney, Agent, or Firm*—Hamilton, Brook, Smith & Reynolds, P.C.

(57) ABSTRACT

A technique for correcting charge transfer inefficiencies in a Charge Coupled Device (CCD). The basic approach is to estimate the charge entering at a given stage in a CCD pipeline, and to then determine an estimate of the error introduced by the accumulated leftover charge that will be present at a second point, farther down the pipeline. The error is then corrected by injecting a correcting charge at a third point, farther still down the CCD pipeline. The invention is used, in one embodiment, to correct the output of a charge to digital converter, although principals of the invention may be used for other types of circuits.

18 Claims, 6 Drawing Sheets

|  | | | | | | | | | | |
|---|---|---|---|---|---|---|---|---|---|---|
| MSBs | 10 | 9 | 8 | 7 | 6 | | | | | |
| + LSBs | | | | | 5 | 4 | 3 | 2 | 1 | 0 |
| − 16 | | | | | 1 | 0 | 0 | 0 | 0 | |
| Converter Value | | 9 | 8 | 7 | 6 | 5 | 4 | 3 | 2 | 1 | 0 |
| Bit Weight | | $2^9$ | $2^8$ | $2^7$ | $2^6$ | $2^5$ | $2^4$ | $2^3$ | $2^2$ | $2^1$ | $2^0$ |

Fig. 3

CORRECTING CHARGE TRANSFER INEFFICIENCY IN A CHARGE COUPLED ANALOG TO DIGITAL CONVERTER

BACKGROUND OF THE INVENTION

The present invention relates to techniques for improving accuracy in charge transfer devices, especially those which use multiple pipelined stages.

Charge transfer devices, including but not limited to Charge Coupled Devices (CCDs), have long been used to implement important functions such as analog to digital conversion (ADC) and digital to analog conversion (DAC) in electronic systems. For example, ADCs and DACs are now an essential part of numerous consumer electronic devices, such as digital cameras, cellular telephones, wireless networking equipment, audio devices such as MP3 players, and video equipment such as Digital Video Disk (DVD) players, High Definition Digital Television (HDTV) equipment, and other products.

There are several ways to implement CCD based converters. One way is described in U.S. Pat. No. 4,375,059 issued to Schlig, which is an early example of a successive approximation, Charge Coupled Device (CCD) based ADC. In that design, a set of charge storage stages is arranged as a serial pipeline register. An input source charge passes from stage to stage down the pipeline. A reference charge generator and a charge splitter at each stage generate reference signals. A first of the reference signals is compared to the source charge that is temporarily stored at the corresponding stage. The comparison generates a binary one, if the source charge is greater than or equal to the first reference charge, or a binary zero, if the source charge is less than the first reference charge. If a binary one is generated, only the stored contents of the stage are passed through to the next successive stage. However, if a binary zero is generated, the stored contents of the stage are passed to a next successive stage, together with a second reference charge, in such a way that the two charges are combined. Auxiliary buffer registers are provided to temporarily store the output bits of the comparators. The buffer registers thus provide a digital output word for each input source charge packet.

A further refinement in CCD-based converter design is found in U.S. Pat. No. 5,579,007 issued to Paul. In that arrangement, the successive approximation pipeline is arranged to handle a serial stream of both positive and negative differential signal charges corresponding to a differential version of the input signal. The differential signal structure provides improved sensitivity in the charge to voltage translation process, and thus increased dynamic range. The structure also exhibits reduce sensitivity to mismatches, by suppression of common mode noise signals in the charge domain.

In order to provide high precision, even the differential successive approximation type CCD converter must often be trimmed or actively calibrated. The precision of the calibration apparatus must therefore be considerably better than the converter itself, making its design quite challenging. These techniques usually require precise, low noise, low DC-offset amplifiers and/or comparators. Unfortunately, thermal noise, low frequency (1/f) noise, and DC voltage offsets produced by these devices still provide limits on the accuracy of the converter.

SUMMARY OF THE INVENTION

One artifact, known as Charge Transfer Inefficiency (CTI), affects the accuracy of every charge transfer device. This phenomenon causes a certain amount of charge to be left behind at every charge transfer operation. This happens even if an attempt is made to empty the stage and transfer all of the stored charge to the next following stage.

The basic approach of the present invention is to estimate the charge entering at a given stage in a charge transfer pipeline, and then determine an estimate of the error introduced by the accumulated leftover charge that will be present at a second point, farther down the pipeline. The error is then corrected by injecting a correcting charge at a third point, farther still down the pipeline.

Although several different models for charge transfer inefficiency can be used to determine an estimate of the charge error, one simple model is to assume that the charge transfer error is a constant percentage of each stored charge packet. An estimate of the accumulative error can then be provided, given the percentage at each stage and the number of charge stages. In the case of this linear model, the estimate is then added and/or subtracted back into the charge packet at a later stage in the pipeline.

In one embodiment, the present invention can be implemented in a differential type charge to digital converter (QDC) that has a positive or "P" side of the pipeline and a minus or "M" side of the pipeline. In such a differential charge type converter, each stage of the two sides contains a comparator that determines which charge packet is smaller. An adjustment charge, $q_A$, is then added to the charge packet at the next charge transfer stage. This charge conversion process continues, on a bit by bit basis, with the amount of the adjustment charge generally decreasing at each bit, generally by a factor of two.

According to one embodiment of the present invention, charge transfer inefficiency (CTI) is corrected as follows. At a stage corresponding to a pre-selected number of transfers down the pipeline, a correction charge, $Q_{correct}$, is added to each side. Since the size of each adjustment charge is fixed, the comparator outputs provide all of the information necessary to determine the contribution that the adjustment charge has made to each packet. Thus, the correction can be computed to correct for the overall charge transfer inefficiency (CTI) effect by adding a single correction charge.

In one of the preferred embodiments, the comparator values taken together provide a means of estimating the size of the signal charge ($q_+$–$q_-$) injected at the top of the pipeline. Thus, the correction charge can be computed as a fixed amount which can correct for the CTI effect on both (a) the adjustment charges added at each stage and (b) the CTI effect on the signal charge.

In the case of a charge-to-digital converter, the output is in fact a digital code. Therefore, correction charges need not actually be added as charge amounts to each channel as charges travel down the pipeline. Thus, in another embodiment of the invention, the CTI correction is by digitally adjusting the digital output values of the charge to digital conversion result.

Further possible implementations will become apparent after reading the following detailed description. For example, the invention is generally applicable to other types of charge transfer devices that exhibit the CTI efficiency problem, such as bucket brigade and charge redistribution designs, as well as CCDs.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 3 illustrates a QDC that has overlapping MSB and LSB stages.

DETAILED DESCRIPTION OF THE INVENTION

A description of preferred embodiments of the invention follows.

In general, the present invention corrects for a Charge Transfer Inefficiency (CTI) phenomenon in a Charge Coupled Device (CCD) pipeline. It is known that any practical CCD pipeline is not ideal in that a very small percentage of each charge is left behind whenever a transfer occurs. The approach of the present invention is to (a) estimate the charge entering or at a given stage in a CCD pipeline; (b) compute an estimate of the cumulative charge error at a second point in the CCD pipeline; and (c) correct the charge error by injecting a correcting charge at a third point in the CCD pipeline.

The essence of the present invention thus is to estimate a cumulative error due to CTI, and then add a correction charge (plus a known optional constant bias charge to allow for a negative cumulative error) to the charge packet at a later stage in the CCD pipeline.

Figure 1:
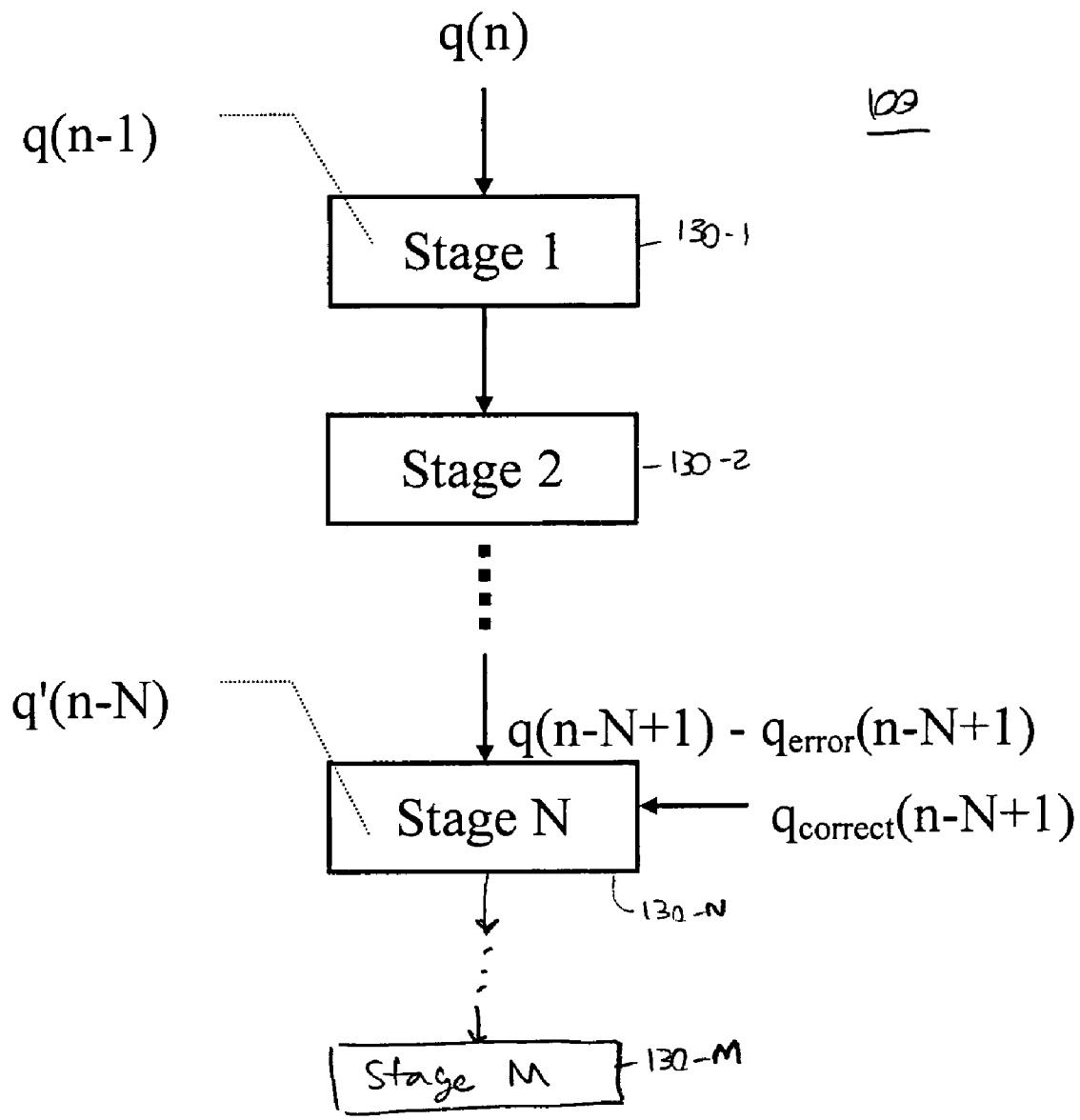
FIG. 1 is a high level flow diagram of fundamental concepts underlying the present invention.

FIG. 1 is a high level diagram of a CCD pipeline 100 illustrating the general concepts of the invention. The CCD pipeline 100 consists of a number, M, of charge storage devices, referred to herein as pipeline stages 130-1, 130-2, . . . , 130-N, . . . 130-M. At any given time, a pipeline input charge, q(n), appears at the input to Stage 1 (130-1) but is not yet stored therein. The charge amount actually stored by Stage 1, q(n−1), corresponds to the pipeline input charge that was present during the previous pipeline clock cycle.

The charge amount held by a given later pipeline stage, Stage N, is denoted herein as q'(n−N), where q' was the corresponding input charge at N cycles previous, plus an accumulative error amount. One can estimate the accumulative error as follows. If the amount of charge in the original packet can be estimated, then it is possible to compute the correction based on an assumed model for CTI. The simplest model (but this patent is not limited to this model) for this per-transfer error is a constant percentage, R, of the charge packet processed by each stage. Thus, at any given Stage, i, of the CCD pipeline 100, an error is introduced into the $n^{th}$ charge packet, $q_i(n)$, when it is transferred from the previous stage, i−1:

$$q_i(n)=q_{i-1}(n)-q_{error}(n,i)=(1-R)q_{i-1}(n)+Rq_i(n-1)$$

and the cumulative error after N transfers is then $$q_{error}(n) = \sum_{i=1}^{N} q_{error}(n, i)$$

The correction charge that needs to be added at stage N is thus equal to the estimated cumulative error. This means that the general form of charge correction as shown in FIG. 1, is to add a correction charge, $q_{correct}$ (n−N+1) back in at stage N.

Figure 2:
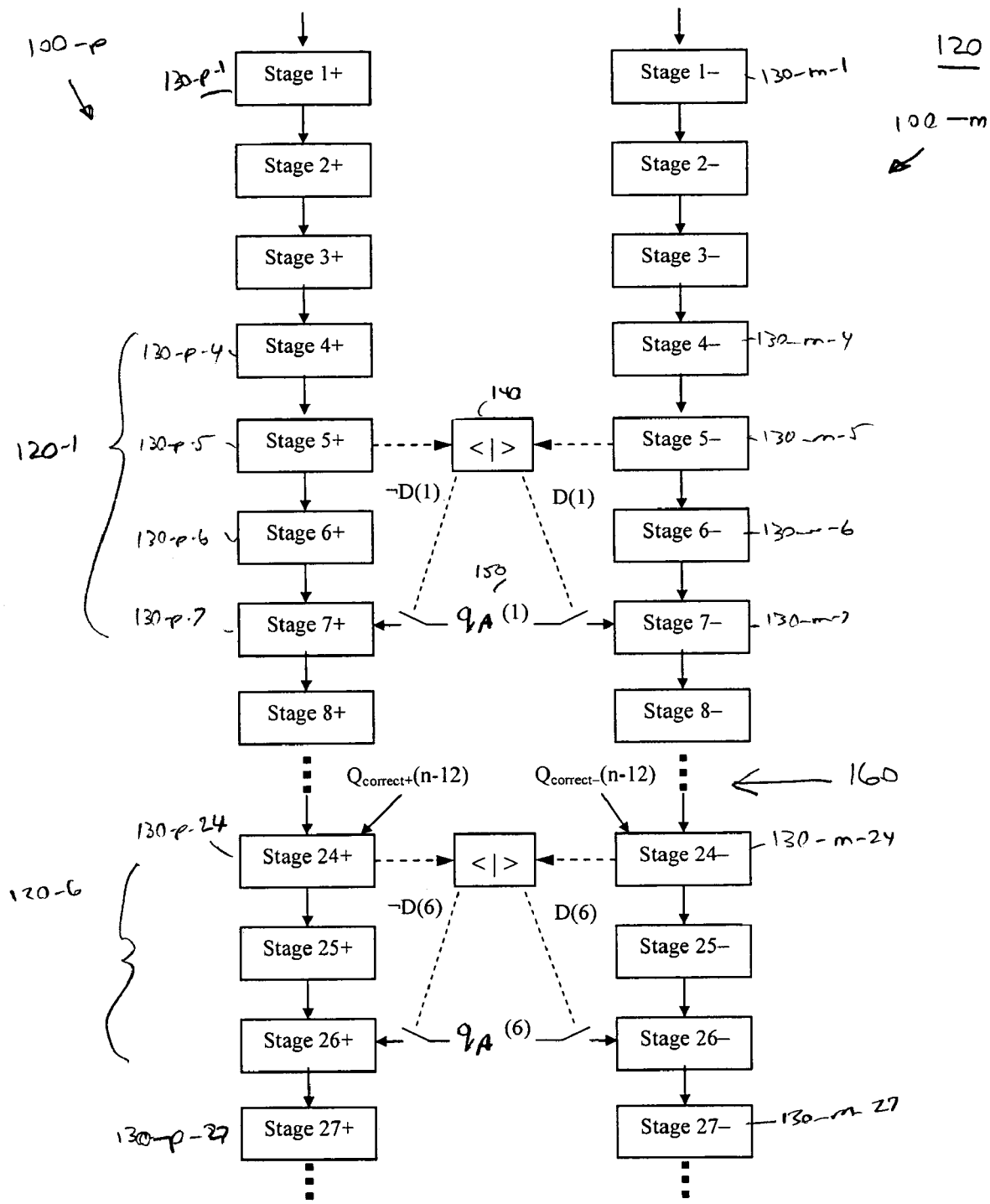
FIG. 2 is a more detailed view of how a CTI correction can be implemented in a differential, successive approximation charge to digital converter (QDC).

FIG. 2 is a detailed diagram of a so-called Charge to Digital Converter (QDC) 120 to which the present invention may be applied. It should be understood that the invention can be applied to many different types of charge transfer devices, and thus the QDC 120 shown in FIG. 2 is by way of example only.

This particular QDC 120 is a successive approximation type converter that uses a number of charge storage stages arranged as a serial pipeline 100. In the illustrated embodiment, the QDC 120 is of differential type, so that there are actually two pipelines 100-p, 100-m that receive a serial stream of Plus (P) and Minus (M) charges corresponding to a differential input signal.

The core elements of the QDC 120 are similar to the QDC described in the aforementioned U.S. Pat. No. 5,579,007 issued to Paul. More particularly, an input charge, q(n), to be converted to a digital value is presented as a complimentary pair of charges, q+(n) and q−(n), with respect to a common mode charge, $q_{cm}$.

Each of the QDC pipelines 100-p, 100-m consist of a respective digital to analog (DAC) ladder that itself is arranged in a number of "bits", or more particularly, converter decision stages 120. There are typically several pipeline stages 130 of the respective pipeline 100-p, 100-m for each converter decision stage 120.

As is known in the art, a given converter decision stage 120-1, consists of several plus pipeline states 130-p-4, . . . , 130-p-7; several minus pipeline stages 120-m-4, 100, 130-m-7; a comparator 140, and a charge adjuster 150. The comparator 140 provides an analog to digital "bit" conversion result [xD(x), D(x)] for its respective position, x, in the DAC ladder. To obtain this result, the comparator 140 compares the charge of the respective converter stage 120 to a reference charge amount; this sets the corresponding bit number "x". Depending upon that comparison result, a converter adjustment charge, q(A) is then either added or subtracted back into the pipeline before the charge is passed along the pipeline 130 to perform the next decision.

However, according to this embodiment of the present invention, CTI correction charges $q_{pcorrect+}(n)$ and $q_{ncorrect-}(n)$ are also added to a selected later stage. In the embodiment shown in FIG. 2, the selected later stage is pipeline stage number N=24. The amount of the correction can be determined in a number of ways, as will be described below.

One way to determine the amount of the correction charge is to develop a model of the Charge Transfer Inefficiency (CTI). Modeling CTI can be complex, but one was is a simple, first-order, model. When charge is transferred from one pipeline stage 130 to the next, a small fraction (R) of the charge (<1%) remains behind, and the rest is transferred. So if $q_i(n)$ is the charge at storage gate i for a sample taken at pipeline cycle n then a first order model is:

$$q_i(n)=(1-R)q_{i-1}(n)+Rq_i(n-1).$$

This can be cast as a discrete-time filter which can be expressed in z-transform notation:

$$Q_i(z)=(1-R)Q_{i-1}(z)+RQ_i(z)z^{-1}$$

(N.B.: where $z^{-1}$ is the transform for a unit delay) or as, $$Q_i(z) = \frac{1-R}{1-Rz^{-1}} Q_{i-1}(z)$$

The example QDC 120 shown in FIG. 2 may be configured to have a 10 bit digital output word. As explained above, at each converter decision stage 120, the charge is compared by comparator 140 and a conversion adjustment charge is applied to the channel by charge adjuster 150 with the least amount of charge: if the plus channel charge, P, is greater than the minus channel charge, M, then the decision produces a '1' bit [D(x)=1] and charge is added to M; if P<M the decision produces a '0' bit [D(x)=0] and charge is added to P. This adjusted amount then represents the signal value in the pipeline channel.

The charge in the channel is alternately transferred from the even numbered stages (with the input considered stage 0) to the odd numbered stages and then from the odd numbered stages to the succeeding even numbered stages. So, at any given time, only half the stages contain charge.

Note that in the illustrated embodiment, for a simple 10 bit QDC, the size of the adjustment charge, $q_A$, starts at half the charge difference corresponding to a full-scale input at the top of the DAC ladder, and decreases by a factor of two for each converter decision stage 120, although other pipeline structures and per-stage adjustment amounts are possible.

The exception to this rule is in an overlapping bit type converter, where the top (overlap) bit of a least Significant Bit (LSB) decision has the same adjustment charge as the bottom bit of a Most Significant Bit (MSB) decision. In particular, in an embodiment as shown in FIG. 3, the converter 120 may be actually formed of 11 stages, 5 Most Significant (MSB) stages, and 6 Least Significant (LSB) stages. The top LSB bit overlaps the bottom MSB bit. This design approach can be used to correct for errors in the MSB conversion. In this arrangement, the digital converter output word, d, is formed from the binary value for the 5 MSB stages (msb), and the binary value for the 6 LSB stages (lsb) as follows:

$$d=32msb+lsb-16.$$

For the sake of the following example, we assume that each converter decision stage 120 has four (4) CCD pipeline transfer stages 130, and that the sample charge is injected at 4 transfers above the top MSB decision stage; for a total of 48 transfer stages 130 in pipeline 100. The CTI correction charge is to be added to the top LSB stage, 24 transfers below the input stage, at stages 130-p-24, 130-m-24. This location in the pipeline will be referred to herein as the correction point 160.

Since the CTI model assigned herein is a linear function (recall the assumption that each stage introduces an amount, R, of error), we can use superposition and treat the CTI effect on the sample charge and the CTI effect on each of the adjustment charges separately.

In addition, it will be assumed that the signal sampler injects a differential charge in the plus 100-p and minus 100-m channels proportional to the input voltage in addition to the common-mode charge, $q_{cm}$. Any common-mode charge is thus assumed to be unchanged by CTI and can be neglected.

So, continuing with development of the model, there are 24 CCD transfers from the input stage 130-p-1, 130-m-1, to the correction point 160. So, the charge at the correction point 160 (i.e., the input differential signal charge at pipeline stage 24) can be described as:

$$Qs_{24}(z) = \left(\frac{(1-R)}{1-Rz^{-1}}\right)^{24} Qs_0(z)$$

Since R is very small this can be approximated by truncating the Taylor expansion of the denominator:

$$Qs_{24}(z) \approx \frac{(1-R)^{24}}{1-\binom{24}{1}Rz^{-1}+\binom{24}{2}R^2z^{-2}-\binom{24}{3}R^3z^{-3}\ldots} Qs_0(z)$$

The number of terms of the expansion that must be kept depends on the acceptable error after correction. For the purpose of this example we neglect terms that contribute an error of ¼ LSB or less. The quadratic term of the expansion is about ¼ LSB (10 bit converter) for R<0.09%, so single lag correction (truncate after the $z^{-1}$ term) is sufficient. If the CTI is worse, the coefficient of the third order term is about ¼ LSB for R<0.5%, so two lag correction (truncate after the $z^{-2}$ term) is suitable up to that CTI value. Larger values of R require more terms to be kept.

For a two lag correction, the corrected charge can be computed from the actual charge in the transform domain by $$Qs_0(z) \approx (1-R)^{-24}(1-24Rz^{-1}+276R^2z^{-2})Qs_{24}(z)$$

Or, in the sampled-data domain, $$qs_0(n) \approx (1-R)^{-24}(qs_{24}(n)-24Rqs_{24}(n-1)+276R^2qs_{24}(n-2)).$$

For a small enough value of R (e.g., 0.09%) we can truncate at the $qs_{24}(n-1)$ term for a single lag correction and compute the signal correction charge as:

$$\Delta qs(n)=qs_0(n)-qs_{24}(n)$$

$$\approx (1-R)^{-24}(qs_{24}(n)-24Rqs_{24}(n-1))-qs_{24}(n)$$

$$\approx ((1-R)^{-24}-1)qs_{24}(n)-24R(1-R)^{-24}qs_{24}(n-1)$$

$$\approx 0.021845qs_{24}(n)-0.022072qs_{24}(n-1)$$

$$\approx 0.021958(qs_{24}(n)-qs_{24}(n-1))$$

For a 10-bit converter, the binary digital value for a positive full scale input voltage should be 1023 and 0 for negative full scale. Zero input voltage should lie exactly halfway between or 511.5 (i.e., 1023/2). If d is the binary value of the conversion result, let $d_{OS}$ be the offset value, d−511.5. If the correct charge were present at the last stage, then the binary digital value, $d_{OS0}$, from the QDC would have corresponded to $qs_0$ instead of the actual charge, $qs_{24}$.

So, to the extent that the QDC output does correspond to $q_{s0}$, the correction for the digital value $d_{OS24}$ (including LSB correction) corresponding to $qs_{24}$ (the value presented by the QDC) is:

$$d_{OS0}(n) \approx (1-R)^{-24}(d_{OS24}(n) - 24R d_{OS24}(n-1) + 276R^2 d_{OS24}(n-2)).$$

For a CTI of 0.09% we can truncate to a single lag correction:

$$d_{O24}(n) \approx 1.02184 d_{OS24}(n) - -0.02160 d_{OS24}(n-1)$$

$$\approx d_{OS24}(n) + -0.02160(d_{OS24}(n) - d_{OS24}(n-1)).$$

For a full-scale input change, the correction amounts to $1023 * -0.02160 = -22.10$ times the weight of the Least Significant Bit. Smaller input changes require proportionately smaller corrections.

The number of transfers in which the adjustment charge is subjected to CTI decreases with decreasing bit weight, since the charge is added progressively further down the signal channel. So the charge correction is similar to the correction for the sampler output but with fewer stages. Denote the number of transfers for each bit, m, from its merge point to the correction point by $T(m)$. $T(10:6) = \{17, 13, 9, 5, 1\}$ in this example.

The adjustment charge added to the signal channel is differential with a sign determined by the value of the corresponding bit in the QDC binary digital output (uncorrected by the LSBs). A '1' indicates that a negative differential charge was added, a '0' that a positive differential charge was added. The magnitude of the charge depends on the bit position—the MSB has a magnitude half the full-scale sampler differential charge, $q_{FS}$, and corresponds to a bit weight of $\pm 256$ (unipolar 0 or 512) times the weight of the LSB. Denote the uncorrected digital value sample n as $b(n)$ and each bit, m, of that value as $b_m(n)$. The MSB is then $b_{10}(n)$.

So, for b[10:6], the charge at the correction point, $Q_{A24}(z, m)$, due to adjustment charge for bit m, $Q_{A0}(z, m)$, is $$Q_{A24}(z, m) = \left(\frac{(1-R)}{1-Rz^{-1}}\right)^{T(m)} Q_{A0}(z, m)$$

$$\approx (1-R)^{T(m)}\left(1 + T(m)Rz^{-1} + \binom{T(m)+1}{2}R^2 z^{-2} + \binom{T(m)+2}{2}R^3 z^{-3} \ldots\right) Q_{A0}(z, m)$$

Note that the series can be truncated in a similar way to the sampler charge, that is, $Q_{A24}(z, m)$ can be corrected to $Q_{A0}(z, m)$ by adding $\Delta Q_A(z, m) = (Q_{A0}(z, m) - Q_{A24}(z, m))$:

$$\Delta Q_A(z, m) \approx (1 - (1-R)^{T(m)}(1 + T(m)Rz^{-1} + \binom{T(m)+1}{2}R^2 z^{-2} \ldots))Q_{A0}(z, m)$$

$$\approx (1 - (1-R)^{T(m)}(1 + T(m)Rz^{-1} + \binom{T(m)+1}{2}R^2 z^{-2} \ldots))\frac{q_{FS}}{2^{10-m}}(0.5 - B_m(z)).$$

If we define the adjustment charge error due to CTI as $\Delta q_A(n, m) = q_{A0}(n, m) - q_{A24}(n, m)$, then $$\Delta q_A(n, m) \approx \frac{q_{FS}}{2^{10-m}}\Big((1 - (1-R)^{T(m)})(0.5 - b_m(n)) - (1-R)^{T(m)}T(m)R(0.5 - b_m(n-1)) - (1-R)^{T(m)}\left(\frac{(T(m)+1)T(m)}{2}\right)R^2(0.5 - b_m(n-2))\Big).$$

For a CTI of 0.09% and a single lag, the correction for b[10] is

NOTE: SAME EQUATION AS LINE ABOVE.

$$\Delta q_A(n, 10) \approx \frac{q_{FS}}{2^{10-m}}(0.01519(0.5 - b_{10}(n)) - 0.01507(0.5 - b_{10}(n-1))).$$

$$\approx \frac{q_{FS}}{2^{10-m}}(0.01519(b_{10}(n-1) - b_{10}(n)))$$

Since a change in charge of $q_{FS}$ corresponds to a change in digital code of 512, the digital equivalent is $$\Delta d_A(n,m) \approx 512(0.01519(0.5 - b_{10}(n)) - 0.01507(0.5 - b_{10}(n-1))).$$

The correction, then, is about 0 if $b_{10}(n) = b_{10}(n-1)$, and $\pm 7.75$ counts (i.e., LSBS) otherwise. The analysis is similar for the rest of the bits down to 6.

TABLE 1

| CTI = 0.09% | |
| --- | --- |
| Bit | Correction |
| 10 | ±7.75 |
| 9 | ±2.97 |
| 8 | ±1.03 |
| 7 | ±0.29 |
| 6 | ±0.03 |

Since the bit 6 correction is so small, bits of smaller weight probably need not be used for the CTI correction. Correction factors for a range of bits are shown in Table 1, assumes a CTI of 0.09%.

Note that the variation with CTI is nearly linear and the ratio between the bits is nearly constant over the CTI variation. The mean ratio of bits 9:6 relative to bit 10 is [0.4393, 0.1892, 0.0845, 0.0371].

Calibration

The analysis above provided a theoretical basis for the correction when the CTI is known. However, when the CTI is not known a priori, either the CTI to be corrected must be estimated or, to be more accurate, a calibration procedure can be used. A general method for calibration is to apply a known, predetermined input charge and then determine a difference between the actual and the ideal charge at the correction point. The following is one example of a calibration procedure.

Direct measurement of the necessary correction can be done using an 8-on, 8-off calibration waveform using the following procedure:

1. Set the input differential charge to 0.
2. Force the adjust charges for the MSBs to toggle every several clock cycles (for example 8 cycles added to the "P" channel followed by 8 cycles added to the "M" channel. The top MSB adjust charge should toggle in the opposite sense from the other MSB adjust charges so that the differential charge nearly balances.

Figure 4:
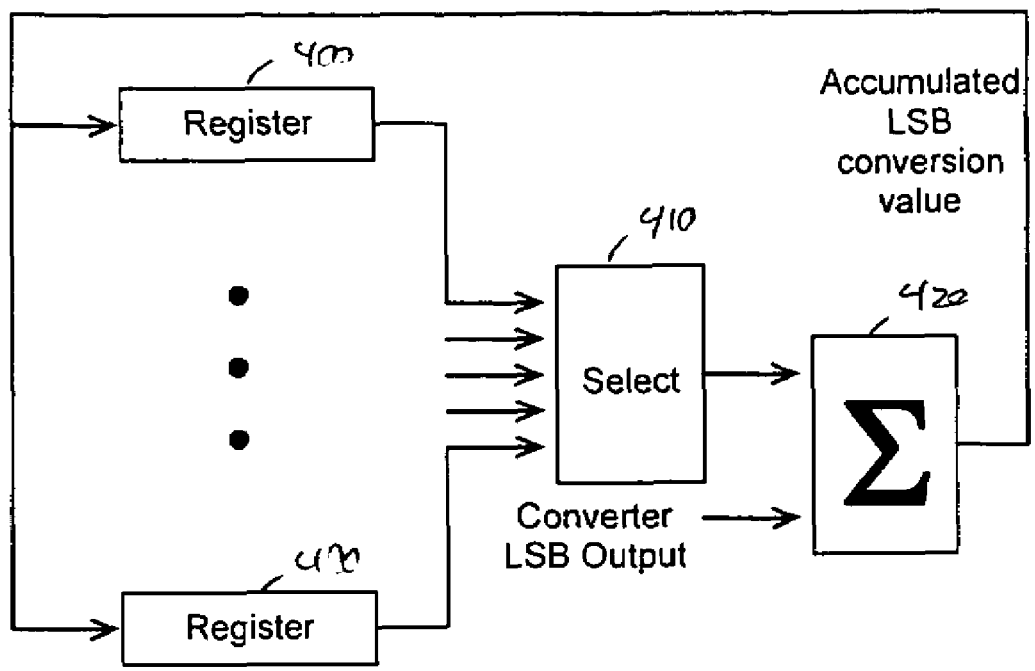
FIG. 4 is a block diagram of a further possible implementation of the invention, where CTI is corrected by adjusting the digital result.

3. Let the LSBs do a standard conversion.
4. If the MSB toggles on sample n, then the conversion of sample n contains a full CTI error. The difference between the LSBs for sample n and the LSBs for sample n+7 (just before the next toggle) is a measure of that fraction of the aggregate correction for the adjust charges applied. Similarly the difference between sample n+8 and sample n+15 (Oust before the complementary toggle) is also a measure of the same quantity.
5. This difference is accumulated for enough cycles to drive down the broadband noise to an acceptable level (an average of about 256 to 512 of these differences). A circuit for this accumulation is shown in FIG. 4, where the registers 400 store the different amount(s), and selector 410 and accumulator 420 provide an average value.

The CTI can be estimated from the average difference calculated, and the corrections for all the MSB adjustment charges can be computed once the CTI estimate is known, or directly, since the ratio of the correction factors is known.

The correction for a full scale signal change can likewise be computed from the CTI estimate. Corrections for smaller signal changes are proportionally smaller.

Calibration could be done with dedicated hardware for all computations but a more flexible implementation would use dedicated hardware to do the accumulations for the correction computation and a low-budget more general-purpose processor to do the rest of the computation.

Digital Correction

Figure 5:
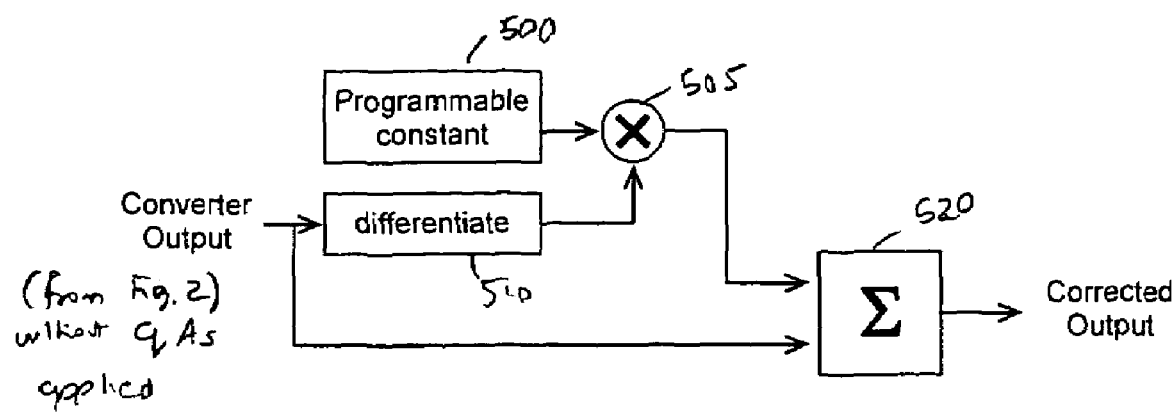
FIG. 5 is a block diagram of one possible implementation of a single lag correction for the signal charges.

In the case of a charge-to-digital converter or other design where the output is in fact a digital code, an equivalent digital correction can be introduced in place of the embedded charge correction shown in FIG. 2. Thus, in another embodiment shown in FIG. 5, a single-lag correction for the signal charges is implemented as a set of programmable digital values 500-1, . . . , 500-n which are conditionally added to or subtracted from the overall converter output depending on whether the corresponding comparator output made a transition from logic 0 to $^a$1, from logic 1 to $^a$0, or remains the same. The transition is detected by differentiator 510, which in turn controls whether a positive negative constant, or $^a$zero value, is presented by multiplier 505 to accumulator 520. One can similarly implement an n-lag correction (not shown.)

Figure 6:
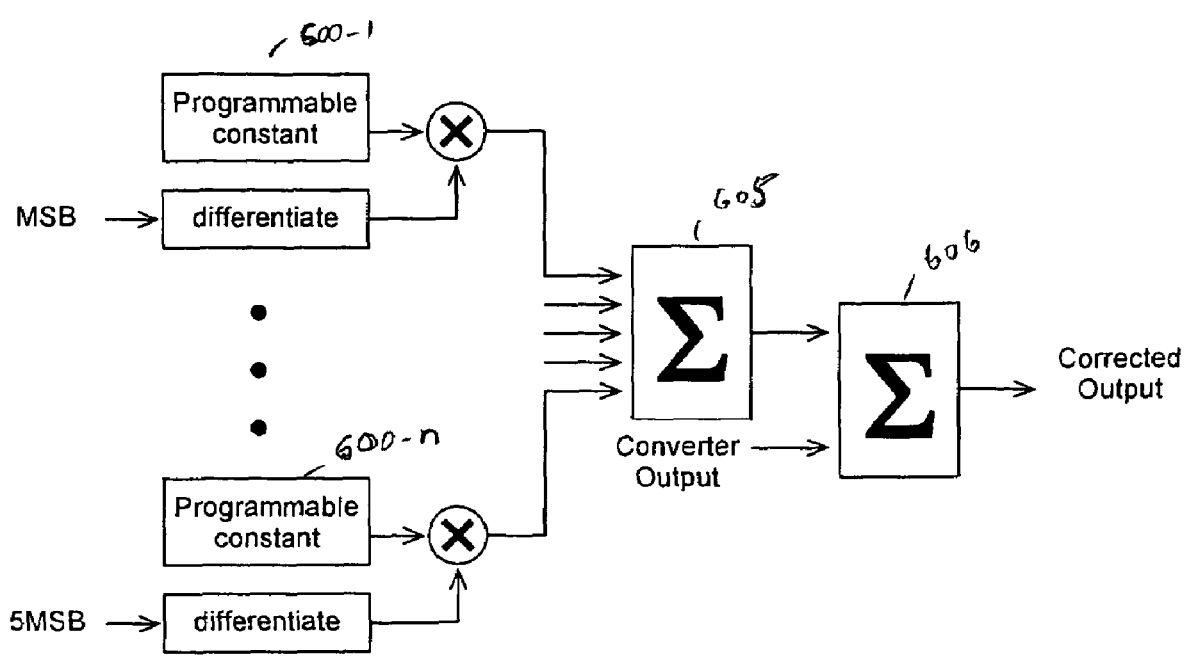
FIG. 6 is a block diagram of one possible implementation of an adjustment charge correction.

Correction for the adjustment charge is shown in FIG. 6. This consists of multiplying the cycle-to-cycle difference in the converter output by a programmable digital constant (600-1, . . . , 600-c) to estimate the correction and then adding that correction to the converter output, via accumulators 605, 606.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method comprising:
   (a) estimating an amount of charge entering at a first selected stage in a multiple stage charge transfer pipeline;
   (b) determining an estimate of an accumulative error introduced at a second selected stage, the second selected stage further along the charge pipeline than the first selected stage; and
   (c) injecting a correction charge in the pipeline to adjust for the accumulative error, and
   wherein the step of (b) determining an estimate of the accumulative error further comprises estimating the accumulative error as a function of a per stage transfer efficiency error and the number of stages between the first selected stage and the second selected stage.

2. A method as in claim 1 wherein the per stage transfer efficiency is estimated as a constant percentage of a corresponding stored charge.

3. A method as in claim 1 wherein the correction charge is injected in the pipeline at a third selected stage which is further along the pipeline than the second selected stage.

4. A method as in claim 1 wherein the multiple stage charge transfer device is a successive approximation charge to digital converter.

5. A method as in claim 4 wherein the charge to digital converter is a differential type charge to digital converter that has a positive "p" side of the pipeline and a minus "m" side of the pipeline, and wherein each side of the pipeline is corrected for accumulative error.

6. A method as in claim 1 wherein the size of the correction charge is fixed.

7. A method comprising:
   (a) estimating an amount of charge entering at a first selected stage in a multiple stage charge transfer pipeline;
   (b) determining an estimate of an accumulative error introduced at a second selected stage, the second selected stage further along the charge pipeline than the first selected stage; and
   (c) injecting a correction charge in the pipeline to adjust for the accumulative error, and
   wherein the size of the correction charge is fixed depending upon an expected charge transfer efficiency.

8. A method as in claim 7 wherein the step of injecting a correction charge comprises digitally adjusting the charge pipeline.

9. A method comprising:
   (a) estimating an amount of charge entering at a first selected stage in a multiple stage charge transfer pipeline;
   (b) determining an estimate of an accumulative error introduced at a second selected stage, the second selected stage further along the charge pipeline than the first selected stage; and
   (c) injecting a correction charge in the pipeline to adjust for the accumulative error, and
   wherein the step of determining the accumulative error additionally comprises:
   applying a predetermined calibration input charge to the first selected stage;
   determining an ideal expected charge that should occur at the second selected stage;
   measuring an actual measured charge at the second selected stage; and
   determining a difference between the ideal expected charge and the actual measured charge.

10. An apparatus comprising:
    (a) a first stage charge detector for determining an amount of charge entering at a first selected stage in the charge pipeline;

(b) an accumulative charge error estimator, for estimating an accumulative charge error introduced at a second selected stage in the charge pipeline, the second selected stage further along the charge pipeline than the first selected stage; and (c) a correction charge injector, for injecting a correction charge in the pipeline to adjust the accumulative charge error for charge transfer inefficiency;

wherein the accumulative charge error estimator produces an accumulative charge error that is a function of a per stage transfer efficiency error and the number of stages between the first selected stage and the second selected stage.

11. An apparatus as in claim 10 wherein accumulative charge error estimator further estimates the per stage transfer efficiency as a constant percentage of a corresponding stored charge.

12. An apparatus as in claim 10 wherein the correction charge injector is coupled to the charge pipeline at a third selected stage which is further along the pipeline than the second selected stage.

13. An apparatus as in claim 10 wherein the multiple stage charge transfer device is a successive approximation charge to digital converter.

14. An apparatus as in claim 13 wherein the charge to digital converter is a differential charge to digital converter that has a positive "p" side of the pipeline and a minus "m" side of the pipeline, and wherein each side of the pipeline is corrected for accumulative error.

15. An apparatus as in claim 10 wherein the size of the correction charge is fixed.

16. An apparatus comprising:
(a) a first stage charge detector for determining an amount of charge entering at a first selected stage in the charge pipeline;
(b) an accumulative charge error estimator, for estimating an accumulative charge error introduced at a second selected stage in the charge pipeline, the second selected stage further along the charge pipeline than the first selected stage; and
(c) a correction charge injector, for injecting a correction charge in the pipeline to adjust the accumulative charge error for charge transfer inefficiency wherein the size of the correction charge is fixed depending upon the expected charge transfer efficiency.

17. An apparatus as in claim 15 wherein the correction charge injector digitally adjusts digital output values from the pipeline.

18. An apparatus comprising:
(a) a first stage charge detector for determining an amount of charge entering at a first selected stage in the charge pipeline;
(b) an accumulative charge error estimator, for estimating an accumulative charge error introduced at a second selected stage in the charge pipeline, the second selected stage further along the charge pipeline than the first selected stage; and
(c) a correction charge injector, for injecting a correction charge in the pipeline to adjust the accumulative charge error for charge transfer inefficiency, wherein the accumulative error estimator further comprises:

a calibration input circuit, arranged to couple a predetermined calibration input charge to the first selected stage;

a detector, for measuring an actual measured charge at the second selected stage; and a difference detector, for determine a difference between an ideal expected charge and the actual measured charge.

* * * * *